United States Patent
Nakajima et al.

(10) Patent No.: US 6,903,457 B2
(45) Date of Patent: Jun. 7, 2005

(54) POWER SEMICONDUCTOR DEVICE

(75) Inventors: Dai Nakajima, Tokyo (JP); Taishi Sasaki, Fukuoka (JP); Toru Kimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 34 days.

(21) Appl. No.: 10/389,954

(22) Filed: Mar. 18, 2003

(65) Prior Publication Data

US 2004/0089931 A1 May 13, 2004

(30) Foreign Application Priority Data

Nov. 13, 2002 (JP) ........................................ 2002-329243

(51) Int. Cl.$^7$ ............................................... H01L 23/34
(52) U.S. Cl. ........................ 257/717; 257/712; 257/713; 257/718
(58) Field of Search ................................. 257/684, 685, 257/701, 706, 712, 713, 718, 717, 723, 724, 787, 796, 788

(56) References Cited

U.S. PATENT DOCUMENTS

| | | | | |
|---|---|---|---|---|
| 5,398,160 A | * | 3/1995 | Umeda | .................... 361/707 |
| 5,493,153 A | * | 2/1996 | Arikawa et al. | ............. 257/796 |
| 5,793,106 A | * | 8/1998 | Yasukawa et al. | .......... 257/712 |
| 6,583,444 B2 | * | 6/2003 | Fjelstad | ........................ 257/82 |
| 6,623,178 B1 | * | 9/2003 | Sakurai et al. | ................ 385/92 |
| 2002/0135061 A1 | * | 9/2002 | Okamoto et al. | ........... 257/703 |
| 2002/0190374 A1 | * | 12/2002 | Nakajima et al. | ........... 257/707 |

FOREIGN PATENT DOCUMENTS

| | | | | |
|---|---|---|---|---|
| EP | 1065916 A2 | * | 1/2001 | ............ H05K/5/06 |
| JP | 59-218759 | * | 12/1984 | ..................... 23/48 |
| JP | 11017071 A | * | 1/1999 | ........... H01L/23/29 |
| JP | 2000-228490 | | 8/2000 | |
| JP | 2001015682 A | * | 1/2001 | ........... H01L/25/07 |
| JP | 2003007933 A | * | 1/2003 | ........... H01L/23/34 |

* cited by examiner

Primary Examiner—Nathan J. Flynn
Assistant Examiner—Victor A. Mandala, Jr.
(74) Attorney, Agent, or Firm—Oblon, Spivak, McClelland, Maier & Neustadt, P.C.

(57) ABSTRACT

A small-sized, light-weight, low-cost power semiconductor device with excellent productivity and vibration resistance is obtained. A mold resin casing (1) is made of a thermosetting resin, such as epoxy resin, and has a top surface (1T) and a bottom surface (1B). A through hole (2) is formed in a non-peripheral portion (in this example, approximately in the center) of the mold resin casing (1) to pass through between the top surface (1T) and the bottom surface (1B). Electrodes (3N, 3P, 4a, 4b) have their first ends projected from sides of the mold resin casing (1). The bottom surface (5B) of a heat spreader (5) is exposed in the bottom surface (1B) of the mold resin casing (1). The heat spreader (5) has an opening (6) formed around the through hole (2).

14 Claims, 10 Drawing Sheets

POWER SEMICONDUCTOR DEVICE

BACKGROUND OF THE INVENTION

1. Field of the Invention

The present invention relates to structure of power semiconductor devices.

2. Description of the Background Art

In a conventional power semiconductor device, power semiconductor elements are bonded on the top surface of an insulative substrate with solder, with the bottom surface of the insulative substrate bonded on the top surface of a metal base plate with solder. The power semiconductor elements are connected to electrodes on the insulative substrate through interconnection wires. The metal base plate is fixed on the top surface of a heat radiating fin with a plurality of bolts. Holes for insertion of the bolts are formed at a plurality of positions along the periphery of the metal base plate and at one position in the center of the metal base plate. A resin case is fixed on the top surface of the metal base plate, avoiding the one bolt disposed in the center of the metal base plate. The insulative substrate, to which the power semiconductor elements are bonded, is disposed within the case. The case is injected with gel to ensure insulation and to protect the wires. The case also contains epoxy resin placed on the gel in order to ensure airtightness (refer to Patent Document 1 shown below).

Patent Document 1: Japanese Patent Application Laid-Open No. 2000-228490 (FIGS. 1 and 2).

In such a conventional power semiconductor device, the case is fixed on the metal base plate, avoiding the bolt located in the center of the metal base plate. This causes a useless space in the center of the metal base plate, leading to an increase in size of the device.

Also, the case is expensive and increases the cost.

Furthermore, the gel injecting and curing processes and epoxy resin injecting and curing processes lower the productivity.

Moreover, when the power semiconductor device is used in an application where it is subjected to external vibrations (e.g. when used on a vehicle), the case and the metal base plate vibrate almost together but the gel vibrates after some delay, which causes relative dislocation between the gel and the case and metal base plate. Then the wires are pulled by the gel and may break due to fatigue at connections with the electrodes.

SUMMARY OF THE INVENTION

An object of the present invention is to obtain a small-sized, light-weight, low-cost power semiconductor device with excellent productivity and vibration resistance.

According to the present invention, a power semiconductor device includes a heat spreader, a power semiconductor element, a mold resin casing, and at least one through hole. The heat spreader has first and second main surfaces that are opposite to each other. The power semiconductor element is provided on the first main surface. The mold resin casing has one main surface that is placed in the same plane with the second main surface and the other main surface that is placed opposite to said one main surface, and the mold resin casing covers the heat spreader and the power semiconductor element while exposing the second main surface. The at least one through hole is formed in a non-peripheral portion of the mold resin casing and passes through between the one main surface and the other main surface while avoiding the power semiconductor element and the heat spreader.

It is thus possible to obtain a small-sized, light-weight, low-cost power semiconductor device with excellent productivity and vibration resistance.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
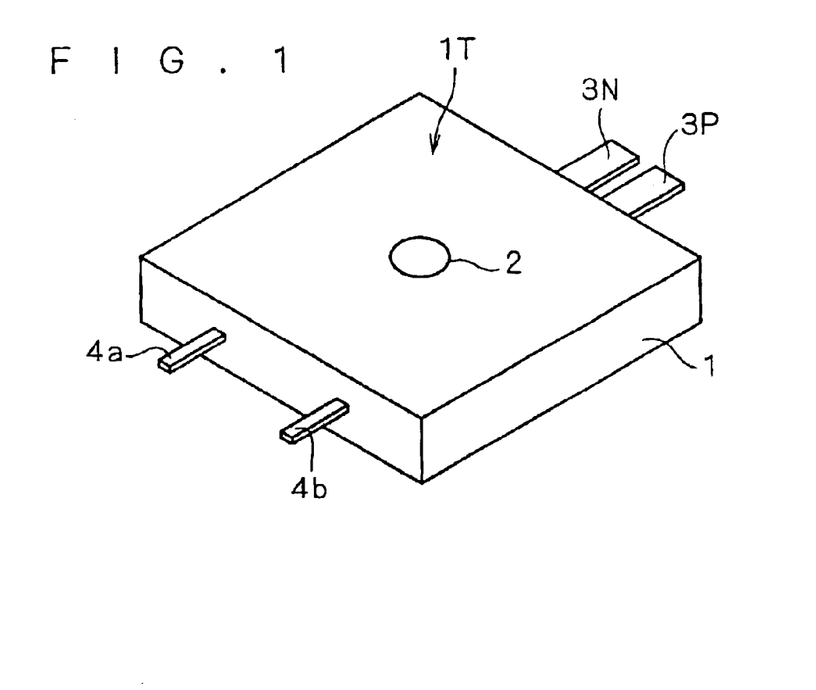
FIG. 1 is a perspective view showing the structure of a power semiconductor device according to a first preferred embodiment of the invention.
Figure 2:
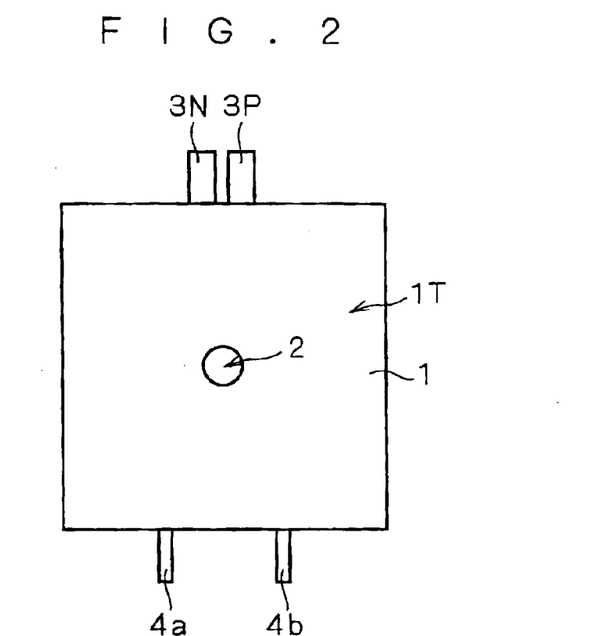
FIG. 2 is a top view showing the structure of the power semiconductor device of the first preferred embodiment of the invention.
Figure 3:
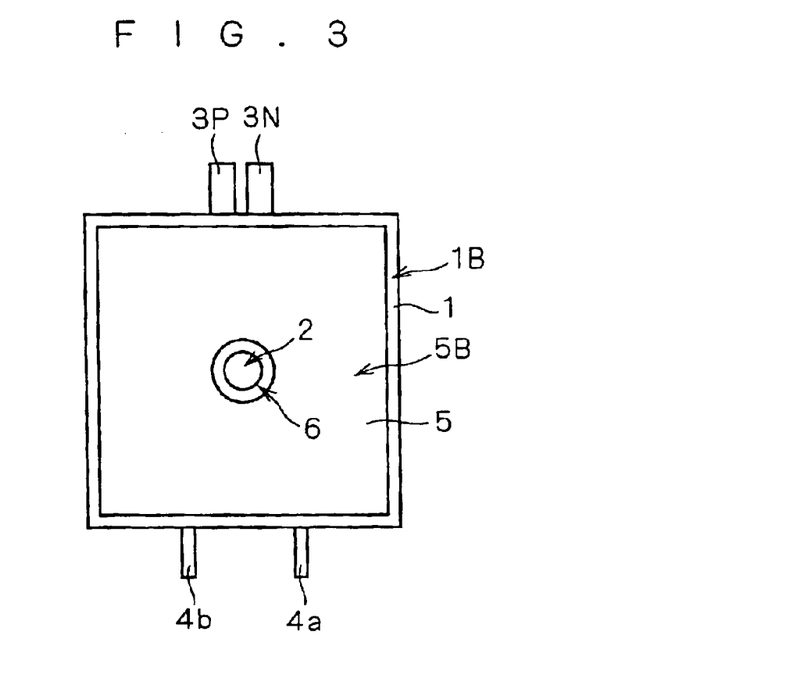
FIG. 3 is a bottom view showing the structure of the power semiconductor device of the first preferred embodiment of the invention.

FIGS. 1 to 3 are respectively a perspective view, a top view, and a bottom view that show the structure of a power semiconductor device according to a first preferred embodiment of the present invention. A mold resin casing 1 is made of a thermosetting resin, such as epoxy resin, and has a top surface 1T and a bottom surface 1B. The mold resin casing 1 further has a through hole 2 that is formed in a non-peripheral position (in this example, approximately in the center) and passes through between the top surface 1T and the bottom surface 1B. Electrodes 3N, 3P, 4a and 4b have their first ends projected from corresponding sides of the mold resin casing 1. Referring to FIG. 3, a heat spreader 5 has a bottom surface 5B that is exposed in the bottom surface 1B of the mold resin casing 1. The heat spreader 5 has an opening 6 that surrounds the through hole 2.

The heat spreader 5 is a metal plate (e.g. a copper plate) having a thickness of about 3 mm. As will be described later, the mold resin casing is attached to a heat radiating fin. When the mold resin casing is attached to an electrically conductive heat radiating fin, an insulative coating material or an insulative material, such as silicone resin or rubber, is provided between the two. Alternatively, instead of providing such coating material or insulative material, an insulative resin layer of about 200 µm in thickness and containing about 50% filler, such as boron nitride, may be formed on the bottom surface 5B of the heat spreader 5. Also, in order to prevent damage to the insulative resin layer due to, e.g. insertion of contaminants, copper foil of about 100 µm in thickness may be formed on the bottom surface of the insulative resin layer.

Figure 4:
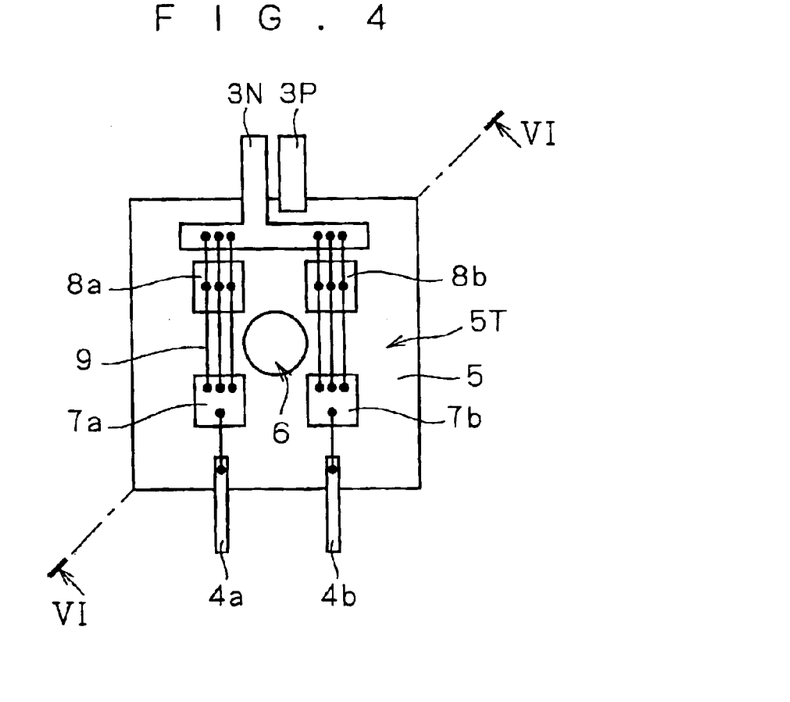
FIG. 4 is a top view showing the structure of the power semiconductor device of the first preferred embodiment of the invention, where the mold resin casing is removed.
Figure 5:
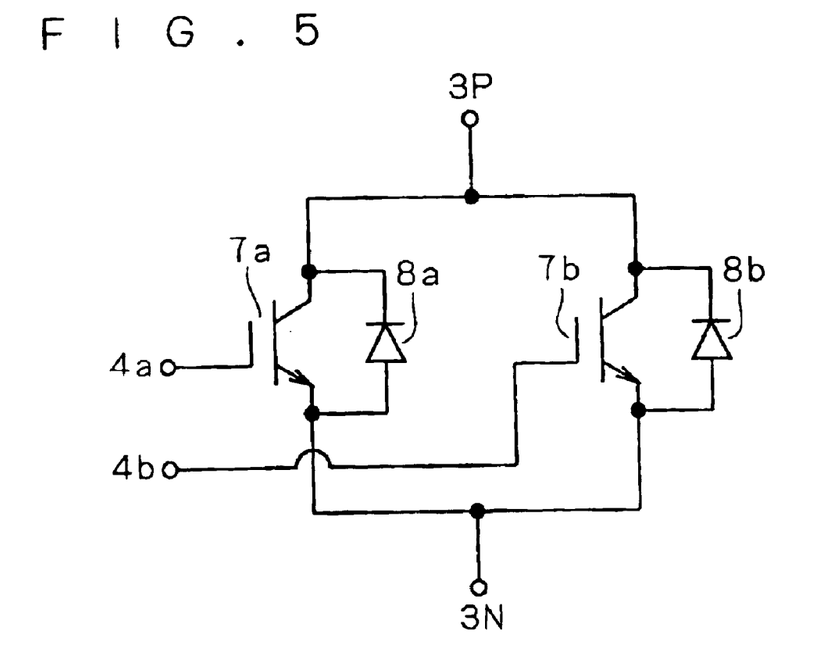
FIG. 5 is a circuit diagram of the power semiconductor device of the first preferred embodiment of the invention.

FIG. 4 is a top view showing the structure of the power semiconductor device of the first preferred embodiment, where the mold resin casing 1 is removed. FIG. 5 is a circuit diagram of the power semiconductor device of the first preferred embodiment. Now referring to FIG. 5, the power semiconductor device of the first preferred embodiment includes IGBTs 7a and 7b and free wheeling diodes 8a and 8b. The collectors of the IGBTs 7a and 7b and the cathodes of the free wheeling diodes 8a and 8b are all connected to the electrode 3P. The emitters of the IGBTs 7a and 7b and the anodes of the free wheeling diodes 8a and 8b are all connected to the electrode 3N. The gates of the IGBTs 7a and 7b are connected to the electrodes 4a and 4b, respectively.

Referring to FIG. 4, the chips of the IGBTs 7a and 7b and the free wheeling diodes 8a and 8b are bonded on the top surface 5T of the heat spreader 5 with solder. The collectors of the IGBTs 7a and 7b and the cathodes of the free wheeling diodes 8a and 8b are formed at the bottom surfaces of the respective chips. Accordingly, the collectors of the IGBTs 7a and 7b and the cathodes of the free wheeling diodes 8a and 8b are all electrically connected to the heat spreader 5. The second end of the electrode 3P is joined by solder to the top surface 5T of the heat spreader 5. As a result, the collectors of the IGBTs 7a and 7b and the cathodes of the free wheeling diodes 8a and 8b are all electrically connected to the electrode 3P through the heat spreader 5.

Gaps of some millimeters or so are provided between the second ends of the electrodes 3N, 4a and 4b and the top surface 5T of the heat spreader 5. The emitters and gates of the IGBTs 7a and 7b and the anodes of the free wheeling diodes 8a and 8b are formed on the top surfaces of the respective chips. The emitters of the IGBTs 7a and 7b and the anodes of the free wheeling diodes 8a and 8b are connected to the second end of the electrode 3N through interconnection wires 9 made, e.g. of aluminum. Similarly, the gates of the IGBTs 7a and 7b are connected respectively to the second ends of the electrodes 4a and 4b through wires 9.

Figure 6:
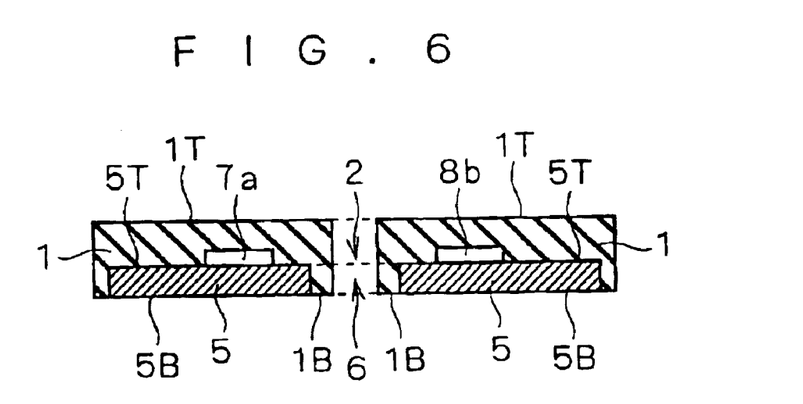
FIG. 6 is a cross-sectional view showing the sectional structure taken along line VI—VI in FIG. 4.

FIG. 6 is a cross-sectional view showing the sectional structure taken along line VI—VI in FIG. 4. The mold resin casing 1 covers the heat spreader 5, the IGBT 7a, and the free wheeling diode 8b and exposes the bottom surface 5B of the heat spreader 5. The through hole 2 is positioned avoiding the heat spreader 5, IGBT 7a, and free wheeling diode 8b. The bottom surface 1B of the mold resin casing 1 and the bottom surface 5B of the heat spreader 5 are positioned in the same plane.

Figure 7:
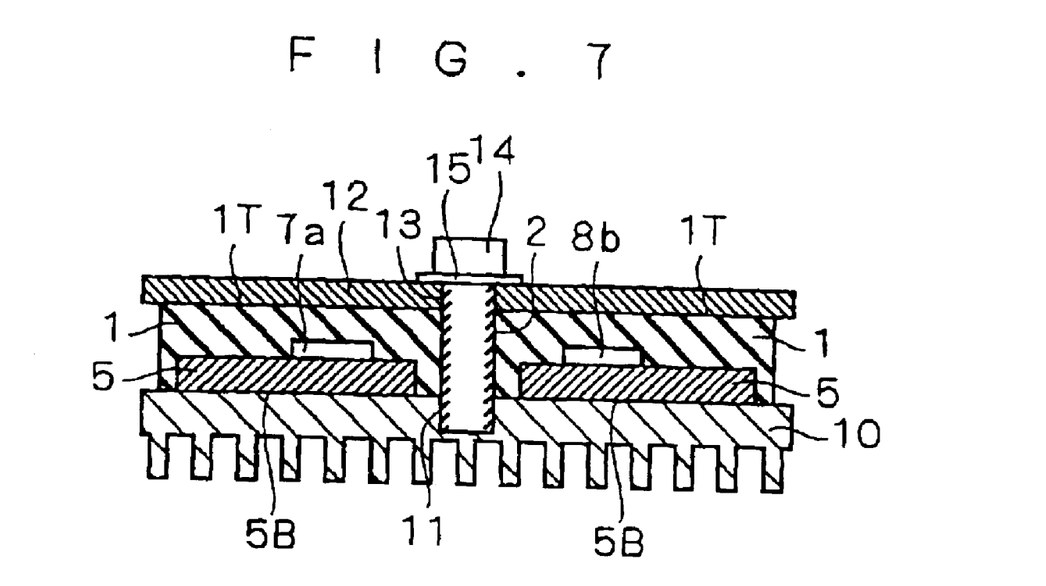
FIGS. 7 and 8 are cross-sectional views showing structures in which the power semiconductor device of the first preferred embodiment is attached to a heat radiating fin.
Figure 8:
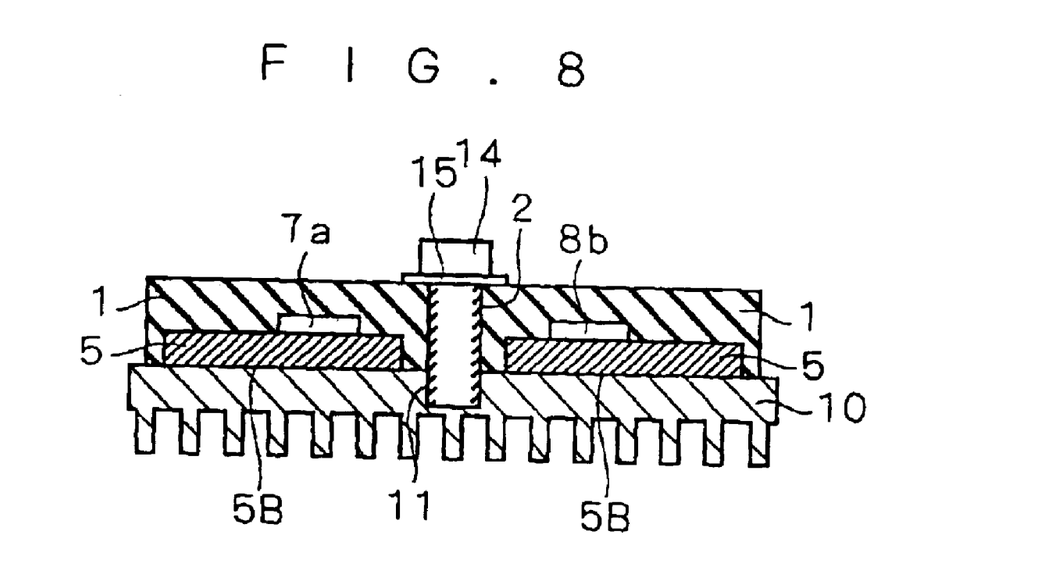

FIGS. 7 and 8, associated with FIG. 6, are cross-sectional views of structures in which the power semiconductor device of the first preferred embodiment is attached to a heat radiating fin 10. Referring to FIG. 7, the top surface of the heat radiating fin 10 is in contact with the bottom surface 5B of the heat spreader 5, with silicone-based heat-conducting grease (not shown) applied therebetween. The heat radiating fin 10 has a screw hole 11 formed in its top surface. The pressing plate 12 is SK steel of about 1 mm in thickness and has a screw hole 13 that passes therethrough. The bottom surface of the pressing plate 12 is in contact with the top surface 1T of the mold resin casing 1. A bolt 14 is inserted in the screw holes 11, 13 and the through hole 2 to fix the heat radiating fin 10 and the pressing plate 12, with the mold resin casing 1 between them. A spring washer 15 is placed between the head of the bolt 14 and the top surface 1T of the mold resin casing 1.

Referring to FIG. 8, the top surface of the heat radiating fin 10 is in contact with the bottom surface 5B of the heat spreader 5, with silicone-based heat-conducting grease (not shown) applied therebetween. The heat radiating fin 10 has a screw hole 11 formed in its top surface. A bolt 14 is inserted in the screw hole 11 and the through hole 2 to fix the mold resin casing 1 and the heat radiating fin 10. A spring washer 15 is placed between the head of the bolt 14 and the top surface 1T of the mold resin casing 1. As stated earlier, the mold resin casing 1 is made of a thermosetting resin. Since thermosetting resins are less likely to undergo creep phenomenon than thermoplastic resins, the top surface 1T of the mold resin casing 1 can be pressed directly by the bolt 14 or the spring washer 15.

As shown above, according to the power semiconductor device of the first preferred embodiment, it is not necessary to fix a case on a metal base plate while avoiding a bolt placed in the center of the metal base plate. This eliminates the wasteful space in the center of the metal base plate. Furthermore, the head of the bolt 14 and the spring washer 15 directly press the top surface of the pressing plate 12 or the top surface 1T of the mold resin casing 1, not the top surface 5T of the heat spreader 5. It is therefore not necessary to ensure an area on the heat spreader 5 for allowing the head of the bolt 14 and the spring washer 15 to press it, and thus there is no need for an unnecessarily large heat spreader 5. This allows the device to be sized smaller than conventional power semiconductor devices.

Furthermore, it is not necessary to use an expensive case and therefore the cost can be lower than those for conventional power semiconductor devices.

Moreover, gel injecting and curing processes are not required, which enhances the productivity as compared with conventional power semiconductor devices.

Moreover, even when the power semiconductor device is used in an application where it undergoes external vibrations (for example, when used on a vehicle), wire breakage due to fatigue, which would be caused when wires are pulled by gel, will not occur. This provides enhanced vibration resistance as compared with conventional power semiconductor devices.

Second Preferred Embodiment

Figure 9:
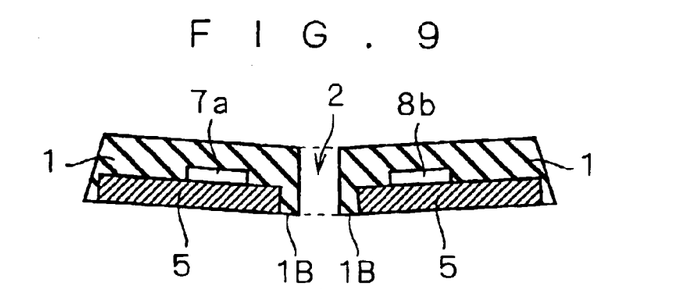
FIG. 9 is a cross-sectional view showing the structure of a power semiconductor device according to a second preferred embodiment of the invention.

FIG. 9, associated with FIG. 6, is a cross-sectional view showing the structure of a power semiconductor device according to a second preferred embodiment of the invention. The mold resin casing 1 is curved in such a way that the central portion of the bottom 1B protrudes from its periphery. Such a curved structure can be formed by preparing materials so that the degree of curing shrinkage or molding shrinkage of the mold resin casing material 1 is larger than the degree of thermal shrinkage of the heat spreader material 5. Also, preferably, the coefficient of linear expansion of the mold resin casing material 1 is set smaller than the coefficient of linear expansion of the heat spreader material 5. For example, when the main material of the heat spreader 5 is copper, the mold resin casing 1 can be made of a material having a coefficient of curing shrinkage of about 0.4% and a coefficient of linear expansion of about $15 \times 10^{-6}$/K. Examples include phenol novolac epoxy materials that contain about 70% mixed filler of crystalline and fused silica. The coefficient of linear expansion of the mold resin casing 1 can be controlled by varying the mixing ratio of crystalline and fused silica.

As shown above, according to the power semiconductor device of the second preferred embodiment, the mold resin casing 1 is curved so that the center portion of the bottom surface 1B protrudes relative to its peripheral portion. This enhances the adhesion between the heat spreader 5 and the heat radiating fin 10 when, as shown in FIG. 7, the mold resin casing 1 is fixed to the heat radiating fin 10 with the pressing plate 12 and the bolt 14.

The effect below can also be obtained when the material of the mold resin casing 1 has a smaller linear expansion coefficient than the material of the heat spreader 5. When the temperature of the mold resin casing 1 and the heat spreader 5 rises because of heat generation of the IGBTs 7a, 7b and the like, the mold resin casing 1 curves in such a direction that the center portion of the bottom surface 1B protrudes relative to its peripheral portion. Then a force works in such a direction as to press the bottom surface 1B of the mold resin casing 1 against the top surface of the heat radiating fin 10, which enhances the adhesion between the heat spreader 5 and the heat radiating fin 10.

Third Preferred Embodiment

Figure 10:
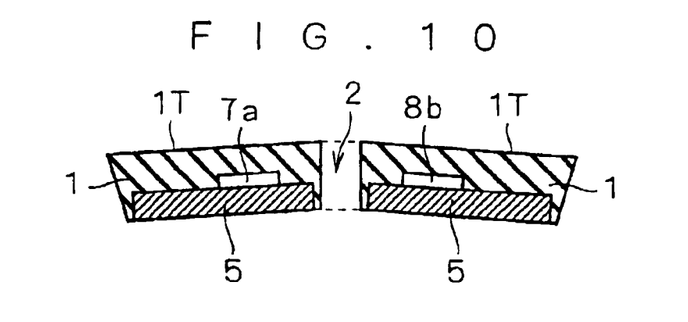
FIG. 10 is a cross-sectional view showing the structure of a power semiconductor device according to a third preferred embodiment of the invention.

FIG. 10, associated with FIG. 6, is a cross-sectional view showing the structure of a power semiconductor device according to a third preferred embodiment of the invention. The mold resin casing 1 is curved so that the central portion of the top surface 1T protrudes from its periphery. Such a curved structure can be formed by preparing materials so that the degree of curing shrinkage or molding shrinkage of the mold resin casing material 1 is smaller than the degree of thermal shrinkage of the heat spreader material 5. For example, when the main material of the heat spreader 5 is aluminum, the mold resin casing 1 can be made of a material having a coefficient of linear expansion of about $20 \times 10^{-6}$/K.

As shown above, according to the power semiconductor device of the third preferred embodiment, the mold resin casing 1 is curved so that the central portion of the top surface 1T protrudes relative to its peripheral portion. This enhances the adhesion between the heat spreader 5 and the heat radiating fin 10 when, as shown in FIG. 8, the mold resin casing 1 is fixed to the heat radiating fin 10 with the bolt 14.

Fourth Preferred Embodiment

Figure 11:
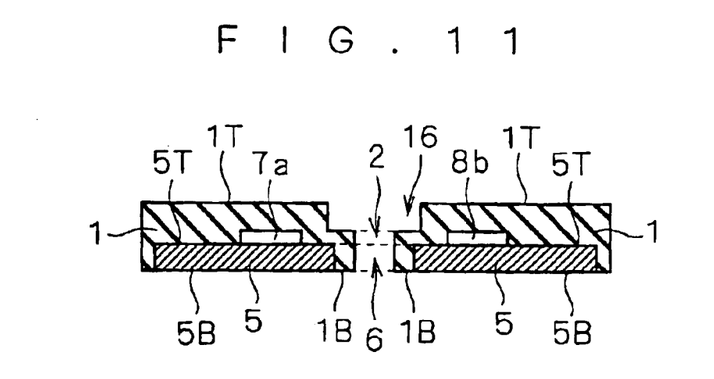
FIGS. 11 to 13 are cross-sectional views showing structures of power semiconductor devices according to a fourth preferred embodiment of the invention.
Figure 12:
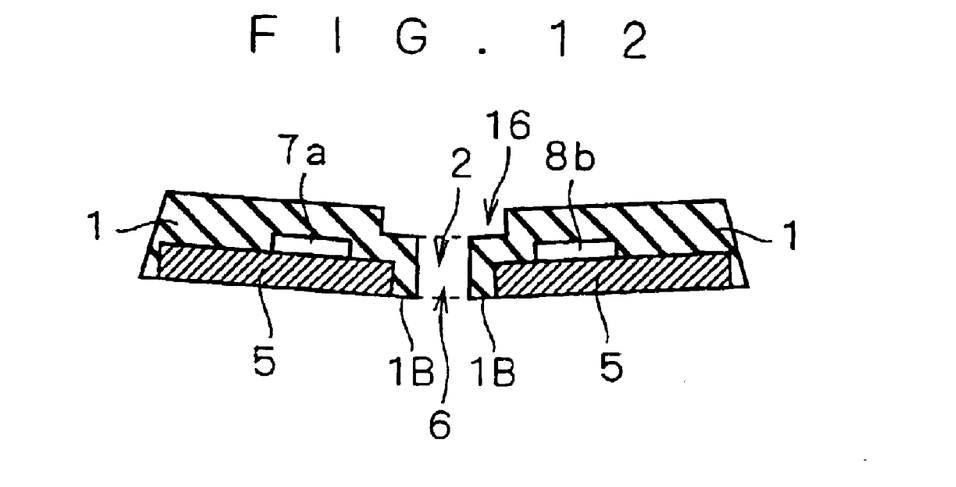
Figure 13:
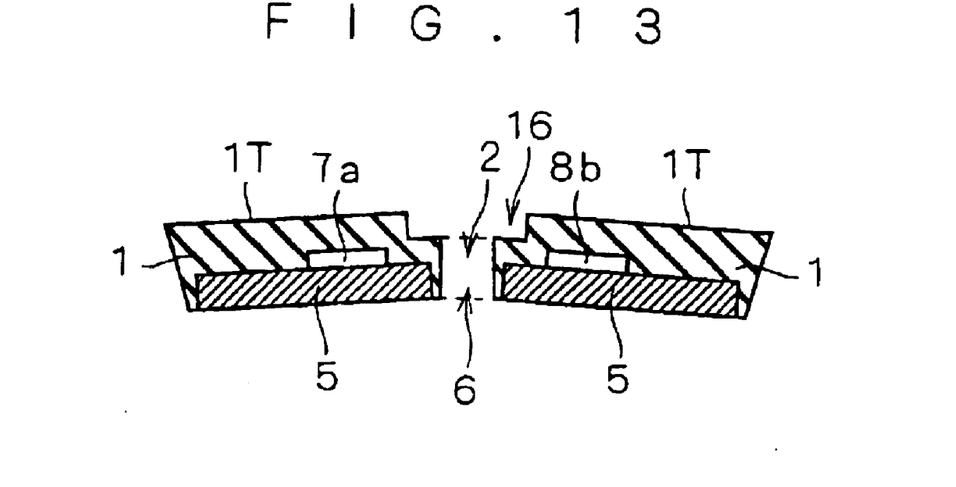

FIGS. 11 to 13 are cross-sectional views showing the structures of power semiconductor devices according to a fourth preferred embodiment of the invention; FIGS. 11 to 13 correspond to FIGS. 6, 9 and 10, respectively. As shown in FIG. 3, the heat spreader 5 has an opening 6 around the through hole 2. As shown in FIGS. 11 to 13, a recess 16 is formed in the top surface of the mold resin casing 1 in correspondence with the opening 6 of the heat spreader 5. Preferably, in order to alleviate stress concentration, the recess 16 is approximately U-shaped in cross-section.

As shown in FIG. 4, no wire 9 is disposed over the opening 6. The formation of the recess 16 in correspondence with the opening 6 of the heat spreader 5 therefore causes no problem in ensuring insulation.

As shown above, according to the power semiconductor device of the fourth preferred embodiment, the mold resin casing 1 is thinner in the portion where the recess 16 is formed. The mold resin casing 1 and the heat radiating fin 10 can therefore be closely adhered together by a smaller fastening force, so that the diameter of the through hole 2 can be made smaller to achieve size and weight reduction of the device.

Furthermore, this eliminates or reduces the projection of the head of the bolt 14 from the top surface 1T of the mold resin casing 1. Accordingly, when a control board is stacked on the power semiconductor devices of FIGS. 11 to 13, the distance between the power semiconductor device and the control board can be shorter, enabling size reduction of the entire device.

Fifth Preferred Embodiment

Figure 14:
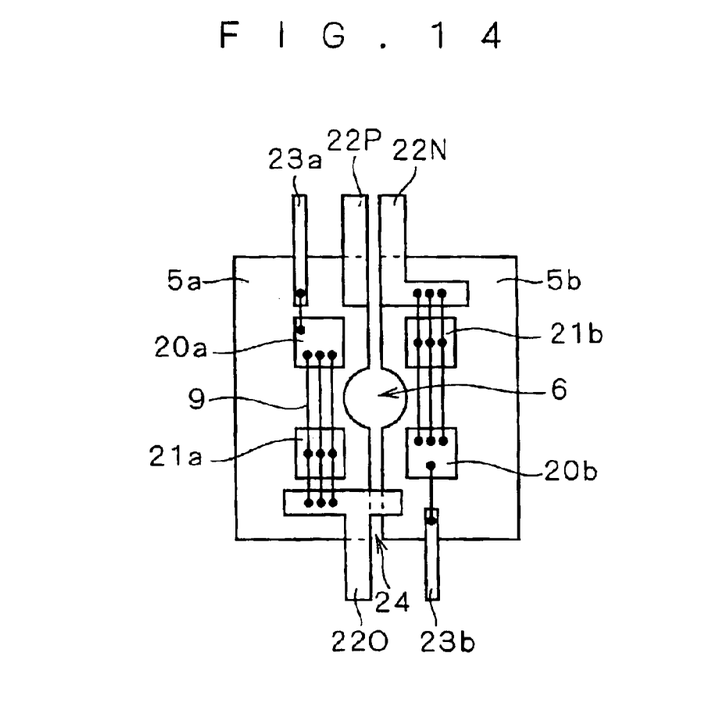
FIG. 14 is a top view showing the structure of a power semiconductor device according to a fifth preferred embodiment of the invention, where the mold resin casing is removed.
Figure 15:
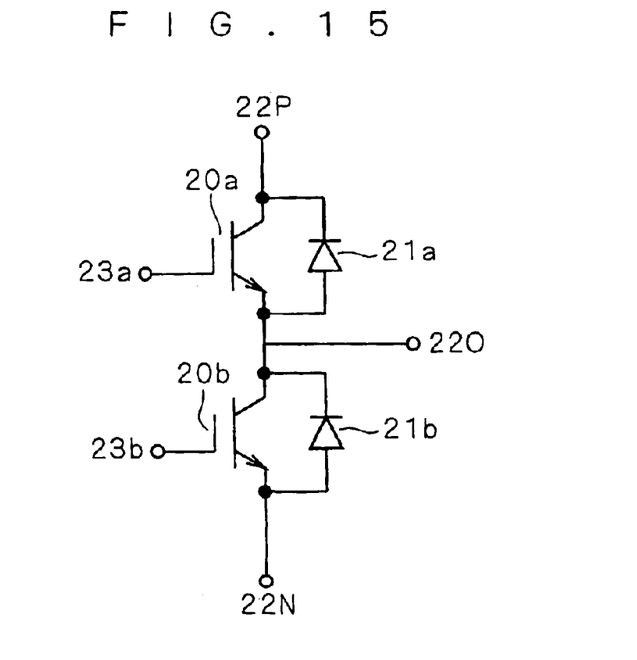
FIG. 15 is a circuit diagram showing the power semiconductor device of the fifth preferred embodiment of the invention.
Figure 16:
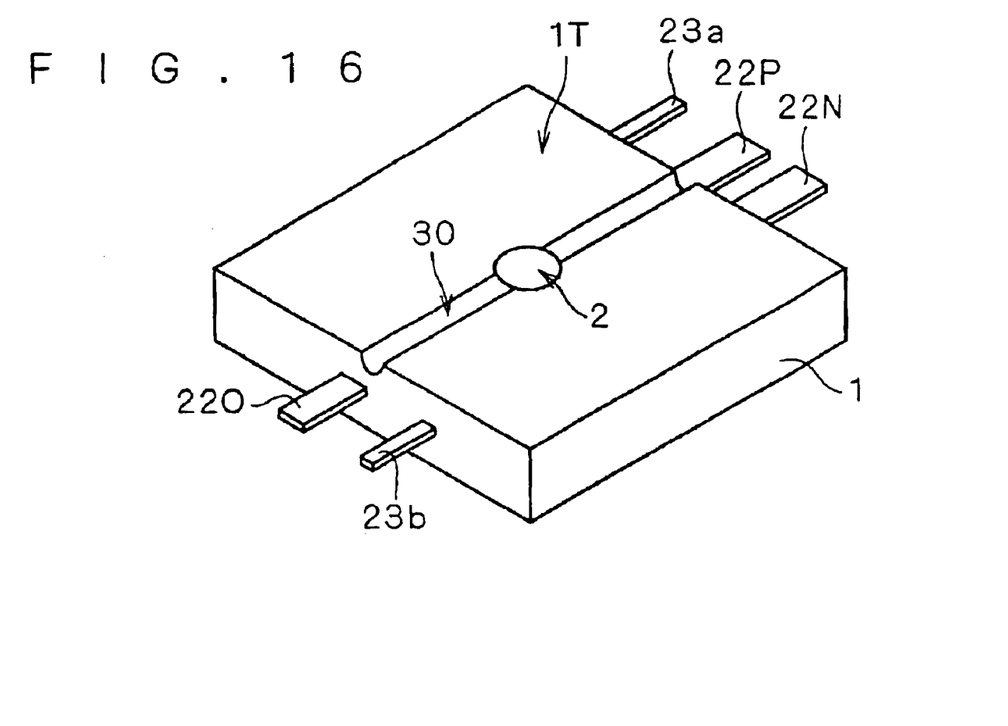
FIG. 16 is a perspective view showing the structure of the power semiconductor device of the fifth preferred embodiment of the invention.

FIG. 14 is a top view showing the structure of a power semiconductor device according to a fifth preferred embodiment, where the mold resin casing 1 is removed. FIG. 15 is a circuit diagram of the power semiconductor device of the fifth preferred embodiment. FIG. 16 is a perspective view showing the structure of the power semiconductor device of the fifth preferred embodiment. Referring now to FIG. 15, the power semiconductor device of the fifth preferred embodiment includes IGBTs 20a and 20b and free wheeling diodes 21a and 21b. The collector of the IGBT 20a and the cathode of the free wheeling diode 21a are both connected to an electrode 22P. The emitter of the IGBT 20b and the anode of the free wheeling diode 21b are both connected to an electrode 22N. The emitter of the IGBT 20a, the collector of the IGBT 20b, the anode of the free wheeling diode 21a, and the cathode of the free wheeling diode 21b are all connected to an electrode 220. The gates of the IGBTs 20a and 20b are connected to electrodes 23a and 23b, respectively.

Referring to FIG. 14, the chips of the IGBT 20a and the free wheeling diode 21a are bonded by solder on the top surface of a heat spreader 5a. The chips of the IGBT 20b and the free wheeling diode 21b are bonded by solder on the top surface of a heat spreader 5b.

Now, the collector of the IGBT 20a and the cathode of the free wheeling diode 21a are formed at the bottom surfaces of the respective chips. Thus the collector of the IGBT 20a and the cathode of the free wheeling diode 21a are both electrically connected to the heat spreader 5a. The electrode 22P is bonded by solder on the top surface of the heat spreader 5a. As a result, the collector of the IGBT 20a and the cathode of the free wheeling diode 21a are both electrically connected to the electrode 22P through the heat spreader 5a.

The collector of the IGBT 20b and the cathode of the free wheeling diode 21b are formed at the bottom surfaces of the respective chips. Thus the collector of the IGBT 20b and the cathode of the free wheeling diode 21b are both electrically connected to the heat spreader 5b. The electrode 220 is bonded by solder on the top surface of the heat spreader 5b. As a result, the collector of the IGBT 20b and the cathode of the free wheeling diode 21b are both electrically connected to the electrode 220 through the heat spreader 5b.

Gaps of some millimeters or so are provided between the electrodes 23a and 220 and the top surface of the heat spreader 5a and between the electrodes 22N and 23b and the top surface of the heat spreader 5b. The emitters and gates of the IGBTs 20a and 20b and the anodes of the free wheeling diodes 21a and 21b are formed on the top surfaces of the respective chips. The gate of the IGBT 20a is connected to the electrode 23a through wire 9. The emitter of the IGBT 20a and the anode of the free wheeling diode 21a are connected to the electrode 220 through wire 9. The gate of the IGBT 20b is connected to the electrode 23b through wire 9. The emitter of the IGBT 20b and the anode of the free wheeling diode 21b are connected to the electrode 22N through wire 9.

Referring to FIG. 14, the heat spreaders 5a and 5b are placed approximately in symmetry about the opening 6. Thus positioning the heat spreaders 5a and 5b approximately symmetrically prevents stress from the bolt 14 from becoming nonuniform. A gap 24 is provided between the heat spreader 5a and the heat spreader 5b in order to ensure insulation. Referring to FIG. 16, a groove-like recess 30, which corresponds to the gap 24, is formed in the top surface 1T of the mold resin casing 1. Preferably, the recess 30 is approximately U-shaped in cross-section in order to alleviate stress concentration. As shown in FIG. 14, no wire 9 is disposed over the gap 24. Therefore forming the recess 30 in correspondence with the gap 24 causes no problem in ensuring insulation.

As shown above, according to the power semiconductor device of the fifth preferred embodiment, the top surface 1T of the mold resin casing 1 has the groove-like recess 30 in correspondence with the gap 24. In the power semiconductor devices of FIGS. 9 and 10, this allows the mold resin casing 1 to easily deform when pressed by the bolt 14. As a result, the mold resin casing 1 and the heat radiating fin 10 can be tightly adhered together by a smaller pressing force, so that the diameter of the through hole 2 can be made smaller to achieve size and weight reduction of the device.

Figure 17:
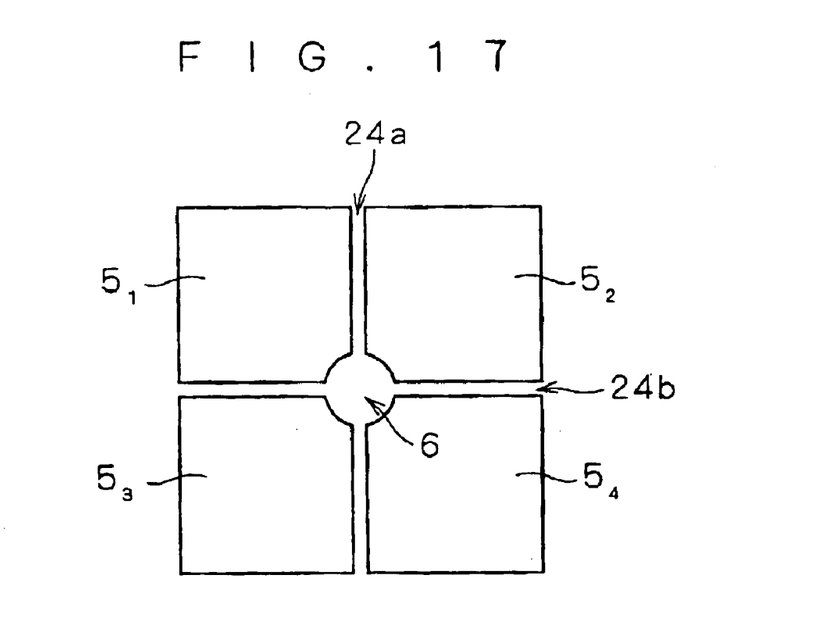
FIG. 17 is a top view showing a modification of the fifth preferred embodiment of the invention.
Figure 18:
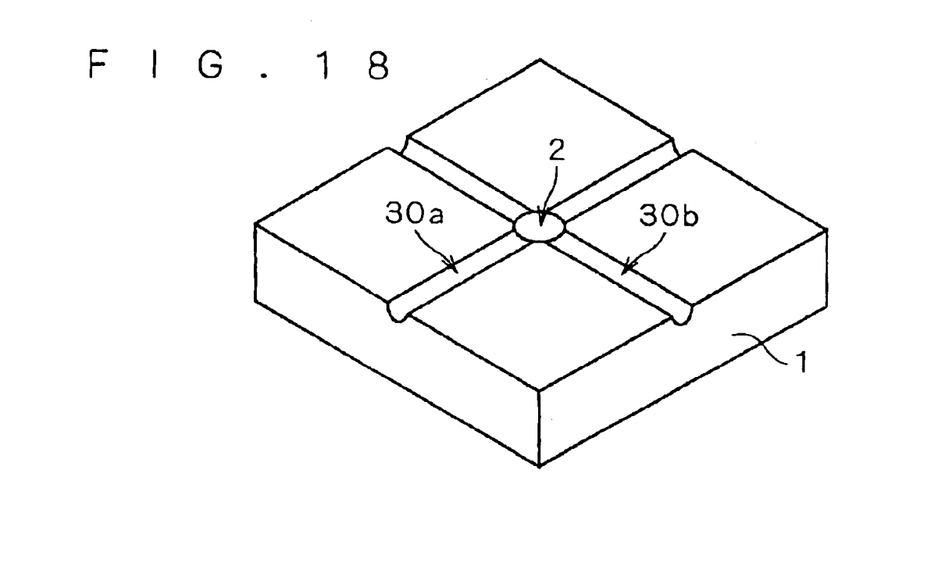
FIG. 18 is a perspective view showing the modification of the fifth preferred embodiment of the invention.

FIGS. 17 and 18 are a top view and a perspective view showing a modification of the fifth preferred embodiment. Referring to FIG. 17, the heat spreader is divided into four heat spreaders $5_1$ to $5_4$. The heat spreaders $5_1$ to $5_4$ are arranged approximately symmetrically around the opening 6. Gaps 24a and 24b are formed between adjacent heat spreaders $5_1$ to $5_4$. Referring to FIG. 18, the top surface 1T of the mold resin casing 1 has groove-like recesses 30a and 30b in correspondence with the gaps 24a and 24b.

Figure 19:
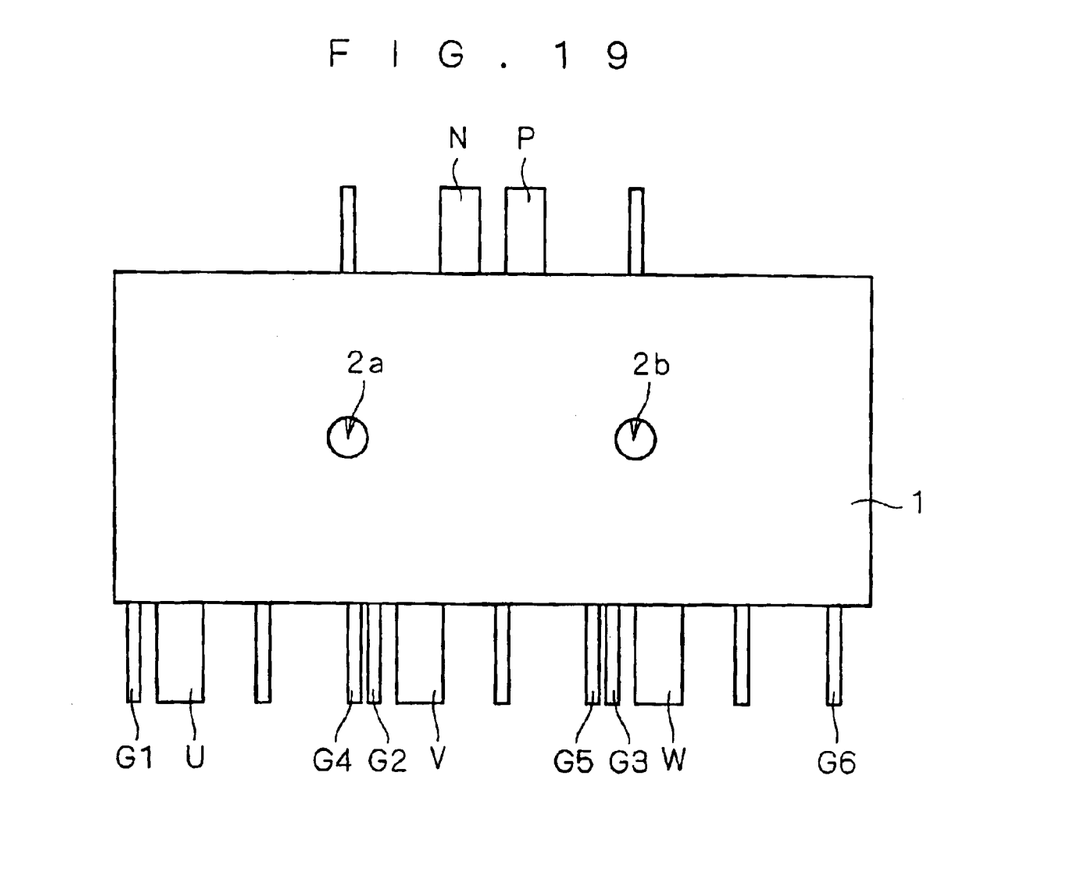
FIG. 19 is a top view showing a modification of the first to fifth preferred embodiments.
Figure 20:
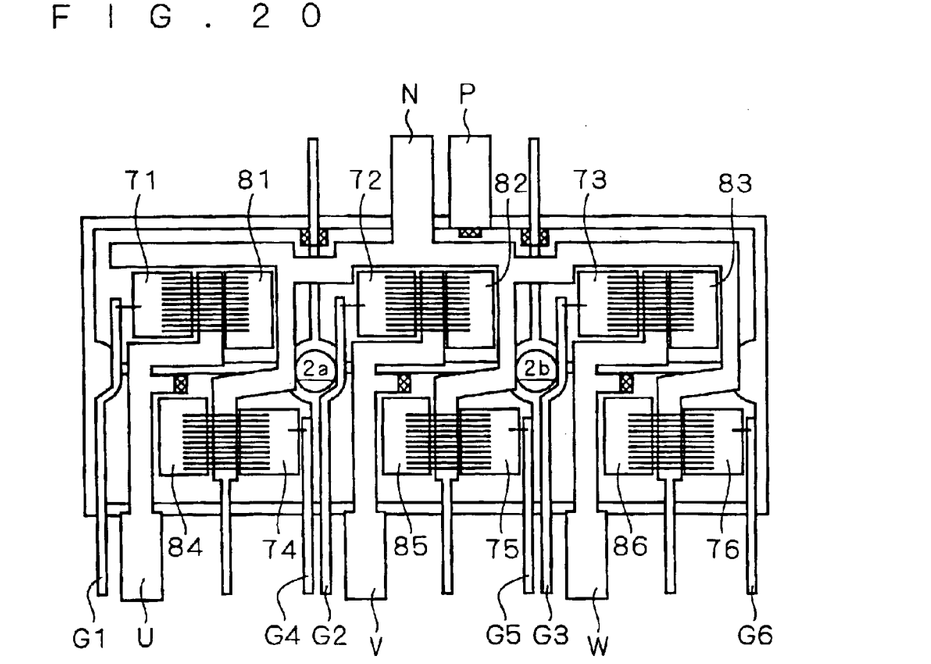
FIG. 20 is a top view showing the structure of the power semiconductor device of FIG. 19, with the mold resin casing removed.
Figure 21:
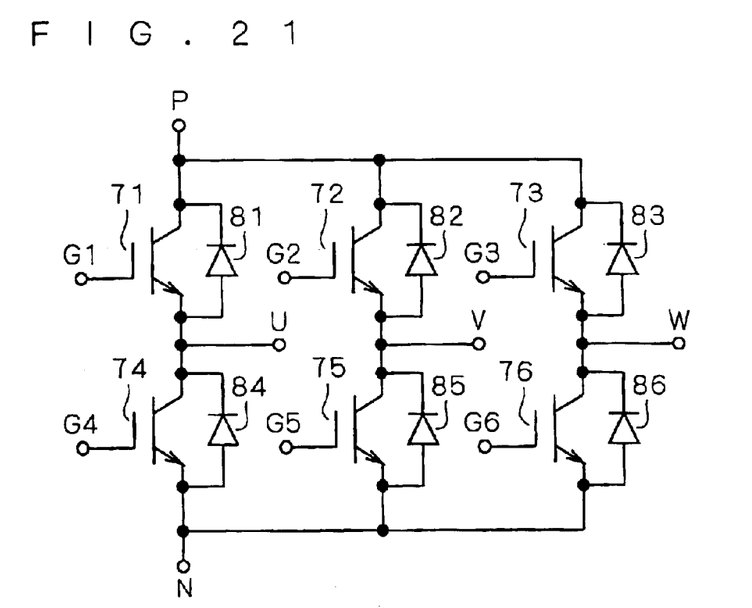
FIG. 21 is a circuit diagram of the power semiconductor device shown in FIG. 20.

FIG. 19 is a top view showing a modification of the first to fifth preferred embodiments. While the first to fifth preferred embodiments have shown the single through hole 2 formed approximately in the center of the mold resin casing 1, a plurality of (in this example, two) through holes 2a and 2b may be formed, as shown in FIG. 19, in a non-peripheral area of the mold resin casing 1. FIG. 20 is a top view showing the structure of the power semiconductor device of FIG. 19, with the mold resin casing 1 removed. FIG. 21 is a circuit diagram of the power semiconductor device of FIG. 20. As shown in FIGS. 20 and 21, the power semiconductor device includes IGBTs 71 to 76, free wheeling diodes 81 to 86, and electrodes P, N, U, V, W, G1 to G6.

While the invention has been described in detail, the foregoing description is in all aspects illustrative and not restrictive. It is understood that numerous other modifications and variations can be devised without departing from the scope of the invention.

What is claimed is:

1. A power semiconductor device comprising:
   a heat spreader having a first main surface and a second main surface that are opposite to each other;
   a power semiconductor element provided on said first main surface;
   a mold resin casing having one main surface that is placed in a same plane with said second main surface and an other main surface that is placed opposite to said one main surface, said mold resin casing covering said heat spreader and said power semiconductor element and exposing said second main surface; and
   at least one through hole formed in a non-peripheral portion of said mold resin casing, said at least one through hole passing through between said one main surface and said other main surface while avoiding said power semiconductor element and said heat spreader.

2. The power semiconductor device according to claim 1, further comprising: a heat radiating fin that is in contact with said second main surface; a pressing plate that is in contact with said other main surface; and a bolt inserted in said through hole, for fixing said heat radiating fin and said pressing plate with said mold resin casing interposed therebetween.

3. The power semiconductor device according to claim 1, wherein said mold resin casing is curved in such a way that a central portion of said other main surface protrudes relative to its peripheral portion.

4. The power semiconductor device according to claim 1, wherein the degree of curing shrinkage or molding shrinkage of material of said mold resin casing is smaller than the degree of thermal shrinkage of material of said heat spreader.

5. The power semiconductor device according to claim 1, further comprising: a heat radiating fin that is in contact with said second main surface; and a bolt inserted in said through hole, for fixing said mold resin casing and said heat radiating fin.

6. The power semiconductor device according to claim 1, wherein the degree of curing shrinkage or molding shrinkage of material of said mold resin casing is larger than the degree of thermal shrinkage of material of said heat spreader.

7. The power semiconductor device according to claim 6, wherein the coefficient of linear expansion of the material of said mold resin casing is smaller than the coefficient of linear expansion of the material of said heat spreader.

8. The power semiconductor device according to claim 1, wherein said heat spreader has an opening formed around said through hole.

9. The power semiconductor device according to claim 8, wherein a recess is formed in said other main surface in correspondence with said opening.

10. The power semiconductor device according to claim 9, wherein said recess is approximately U-shaped in cross-section.

11. The power semiconductor device according to claim 1, wherein said heat spreader includes a plurality of heat spreaders and said plurality of heat spreaders are arranged approximately symmetrically around said through hole.

12. The power semiconductor device according to claim 11, wherein said other main surface has a groove-like recess formed in correspondence with a gap between said heat spreaders.

13. The power semiconductor device according to claim 12, wherein said recess is approximately U-shaped in cross-section.

14. A power semiconductor device comprising:
- a heat spreader having a first main surface and a second main surface that are opposite to each other;
- a power semiconductor element provided on said first main surface;
- a mold resin casing havina one main surface that is placed in a same plane with said second main surface and an other main surface that is placed opposite to said one main surface, said mold resin casing covering said heat spreader and said power semiconductor element and exposing said second main surface; and
- at least one through hole formed in a non-peripheral portion of said mold resin casing, said at least one through hole passing through between said one main surface and said other main surface while avoiding said power semiconductor element and said heat spreader, wherein
- said mold resin casing is curved in such a way that a central portion of said one main surface protrudes relative to its peripheral portion.

* * * * *